United States Patent [19]

Miyamoto

[11] Patent Number: 5,364,499
[45] Date of Patent: Nov. 15, 1994

[54] DRY ETCHING PROCESS FOR GALLIUM ARSENIDE EXCELLENT IN SELECTIVITY WITH RESPECT TO ALUMINUM GALLIUM ARSENIDE

[75] Inventor: Hironobu Miyamoto, Tokyo, Japan
[73] Assignee: NEC Corporation, Tokyo, Japan
[21] Appl. No.: 811,679
[22] Filed: Dec. 23, 1991
[30] Foreign Application Priority Data
  Dec. 24, 1990 [JP] Japan .................... 2-413331
[51] Int. Cl.[5] .......................................... H01L 21/00
[52] U.S. Cl. .................... 156/662; 156/643; 156/646; 156/664
[58] Field of Search ............... 156/643, 646, 662, 664
[56] References Cited

U.S. PATENT DOCUMENTS 4,734,152  3/1988  Geis et al. .................... 156/656
4,874,459 10/1989  Coldren et al. ............... 156/646

OTHER PUBLICATIONS

"Reactive Ion Etching of Gallium Arsenide, Aluminum Gallium Arsenide-to-Aluminum Gallium Arsenide Selectivity Using Sulfur Hexafluoride And Silicon, Tetrachloride"; Appl. Phys. Lett. 51 (14), 1083–5, 1987, Salimian et al.
"Reactive Ion Etching of Gallium Arsenide, Aluminum Gallium Arsenide, Gallium Antimonide In Chlorine And Tetrachlorosilane"; J. Vac. Sci. Technology, B, 8(4), 607–17; 1990; Pearton et al.

Primary Examiner—Robert Kunemund
Assistant Examiner—George Goudreau
Attorney, Agent, or Firm—Sughrue, Mion, Zinn, Macpeak & Seas

[57] ABSTRACT

A dry etching process achieves an excellent selectivity between aluminum gallium arsenide and gallium arsenide, and gaseous mixture containing chlorine and sulfur hexafluoride is used as an etchant for selectively etching the gallium arsenide with respect to the aluminum gallium arsenide without sacrifice of the controllability of the dry etching system as well as of the environment.

4 Claims, 4 Drawing Sheets

DRY ETCHING PROCESS FOR GALLIUM ARSENIDE EXCELLENT IN SELECTIVITY WITH RESPECT TO ALUMINUM GALLIUM ARSENIDE

FIELD OF THE INVENTION

This invention relates to a dry etching process and, more particularly, to an etchant used in the dry etching process for improving the selectivity between gallium arsenide and aluminum gallium arsenide.

DESCRIPTION OF THE RELATED ART

A practical usage of the dry etching process for gallium arsenide with respect to aluminum gallium arsenide is disclosed by Hikosaka et. al. in Japan Journal of Applied Physics Letters, 20-L847, 1981. Hikosaka et. al. apply the dry etching process to a heterojunction field effect transistor in AlGaAs/GaAs system. In detail, in order to preferably control the threshold voltage of the heterojunction field effect transistor, it is important to regulate the distance between the gate electrode and the active layer. Hikosaka et. al. propose to embed an aluminum gallium arsenide film with thickness of 2 nanometer in the gallium arsenide film grown on the aluminum gallium arsenide film. The etchant is effective against the gallium arsenide film but is less effective against the aluminum gallium arsenide. Therefore, the dry etching rapidly proceeds in the gallium arsenide film, and substantially terminates on the upper surface of the aluminum gallium arsenide film embedded in the gallium arsenide film. Therefore, the dry etching process can make the distance between the gate electrode and the active layer uniform, and reproduce the transistor characteristics.

The dry etching technique is based on difference in evaporability between reactants of different substances. In the AlGaAs/GaAs system, an aluminum fluoride ($AlF_x$) is hardly evaporated rather than a gallium fluoride ($GaF_x$), and Hikosaka et. al. proposed Fluon No. 12 (the substance expressed as $CCL_2F_2$) as an etchant in Japan Journal of Applied Physics Letters, 20-L847, 1981, and Fluon No, 12 has been widely used for the selective dry etching between the aluminum gallium arsenide and the gallium arsenide.

However, a problem is encountered in the prior art dry etching process in controllability. In detail, Fluon No. 12 achieves a good selectivity under certain conditions. However, the certain conditions are close to conditions of a plasma polymerized film. In order promote the selective etching without the undesirable polymerization, the dry etching system is required to be strictly controlled.

Moreover, the prior art dry etching process is liable to damage a semiconductor structure. If the self-bias voltage is lowered, the semiconductor structure is less damaged, and the low self-bias voltage hardly deteriorates the properties of semiconductor substance such as, for example, electron mobility and electron density. However, the low self-bias voltage tends to promote the plasma polymerized film. For this reason, the self-bias voltage is kept in relatively high, and the relatively high bias voltage tends to damage the properties of the semiconductor substance.

Finally, Fluon No. 12 attacks the ozone layer, and is, therefore, undesirable in view of environment protection.

SUMMARY OF THE INVENTION

It is therefore an important object of the present invention provide a dry etching process which is free from the problems inherent in the prior art etchant.

To accomplish the object, the present invention proposes to use gaseous mixture containing chlorine and sulfur hexafluoride as an etchant.

In accordance with the present invention, there is provided a dry etching process comprising: the steps of a) preparing a dry etching system with an etching chamber, a semiconductor structure having an aluminum gallium arsenide film and a gallium arsenide film, and an etchant containing chlorine gas and sulfur hexafluoride gas; b) placing the semiconductor structure in the etching chamber of the dry etching system; and c) supplying the etchant to the etching chamber for etching the gallium arsenide film.

BRIEF DESCRIPTION OF THE DRAWINGS

The feature and advantages of the dry etching process according to the present invention will be more clearly understood from the following description taken in conjunction with the accompanying drawings in which.

DESCRIPTION OF THE PREFERRED EMBODIMENT

Figure 1:
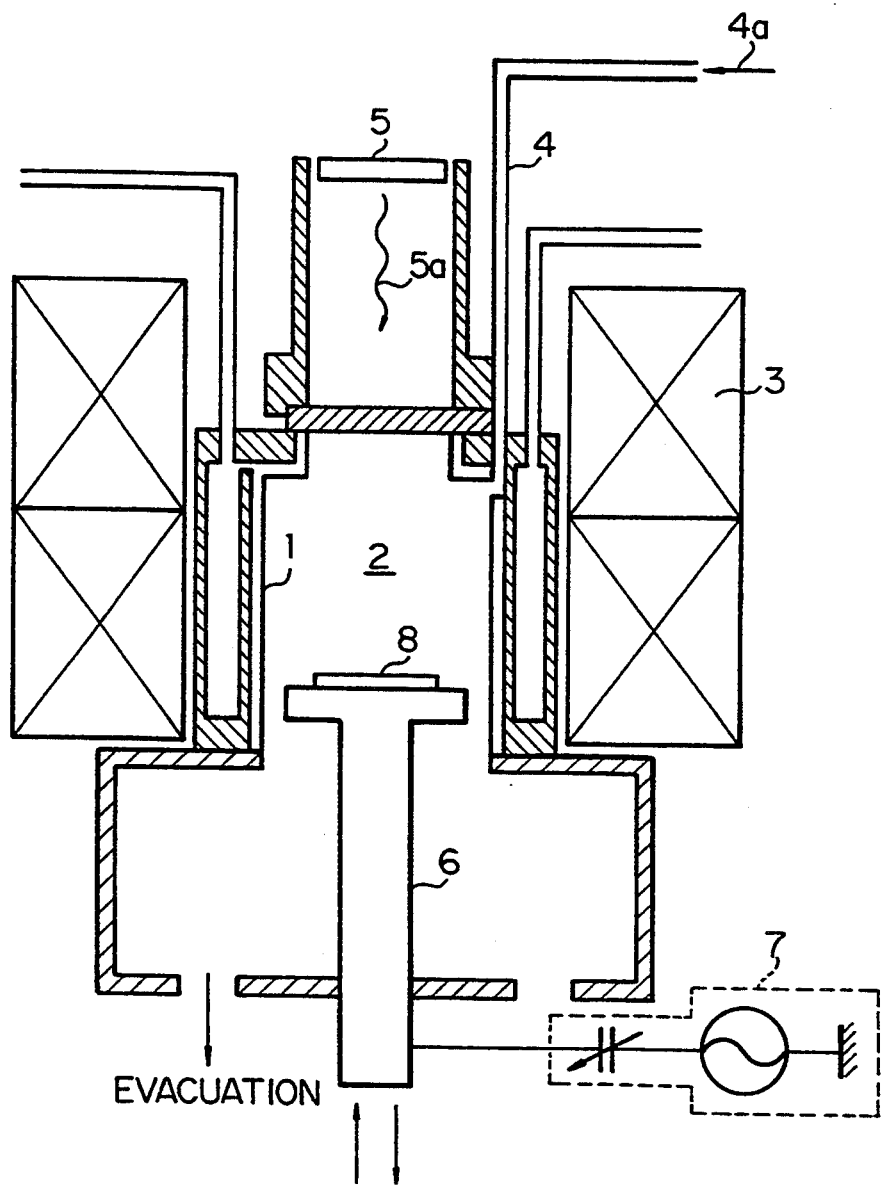
FIG. 1 is a schematic view showing a dry etching system used in a dry etching process according to the present invention.

Referring first to FIG. 1 of the drawings, a dry etching system comprises a wall member 1 defining a plasma chamber 2, a coil unit 3 associated with the plasma chamber 2, a gas inlet 4 for supplying an etchant 4a into the plasma chamber 2, a microwave source 5 emitting microwave 5a to the plasma chamber 2, and a retainer 6 coupled with an rf biasing unit 7. Though not shown in FIG. 1, the plasma chamber 2 is conducted to an evacuation system, and the evacuation system creates vacuum ambience in the plasma chamber 2. The retainer 6 projects into the plasma chamber 2, and a semiconductor structure 8 is mounted on the retainer 6. The dry etching system thus arranged is of a plasma etching system assisted with electron cyclotron resonance (which is abbreviated as ECR).

The etching process starts with preparation of the dry etching system shown in FIG. 1, the etchant 4a and the semiconductor structure 8 having a gallium arsenide film and an aluminum gallium arsenide film. The semiconductor structure 8 is placed on the retainer 6 in the plasma chamber 2, and the evacuation system develops vacuum ambience of about $7 \times 10^{-4}$ torr in the plasma chamber 2. The etchant 4a is supplied to the plasma chamber 2 at the flow rate of 34 sccm, and the microwave 5a of 2.45 GHz is radiated into the plasma chamber 2 at about 300 watts for producing plasma. The coil unit 3 allows the semiconductor structure 8 to stay in the ECR position. The rf bias unit 7 applies rf power of about 50 watts at 13.56 MHz to the semiconductor structure 8, thereby controlling the ion energy radiated onto the semiconductor structure 8. A dry etching is carried out in the plasma chamber 2.

Figure 2:
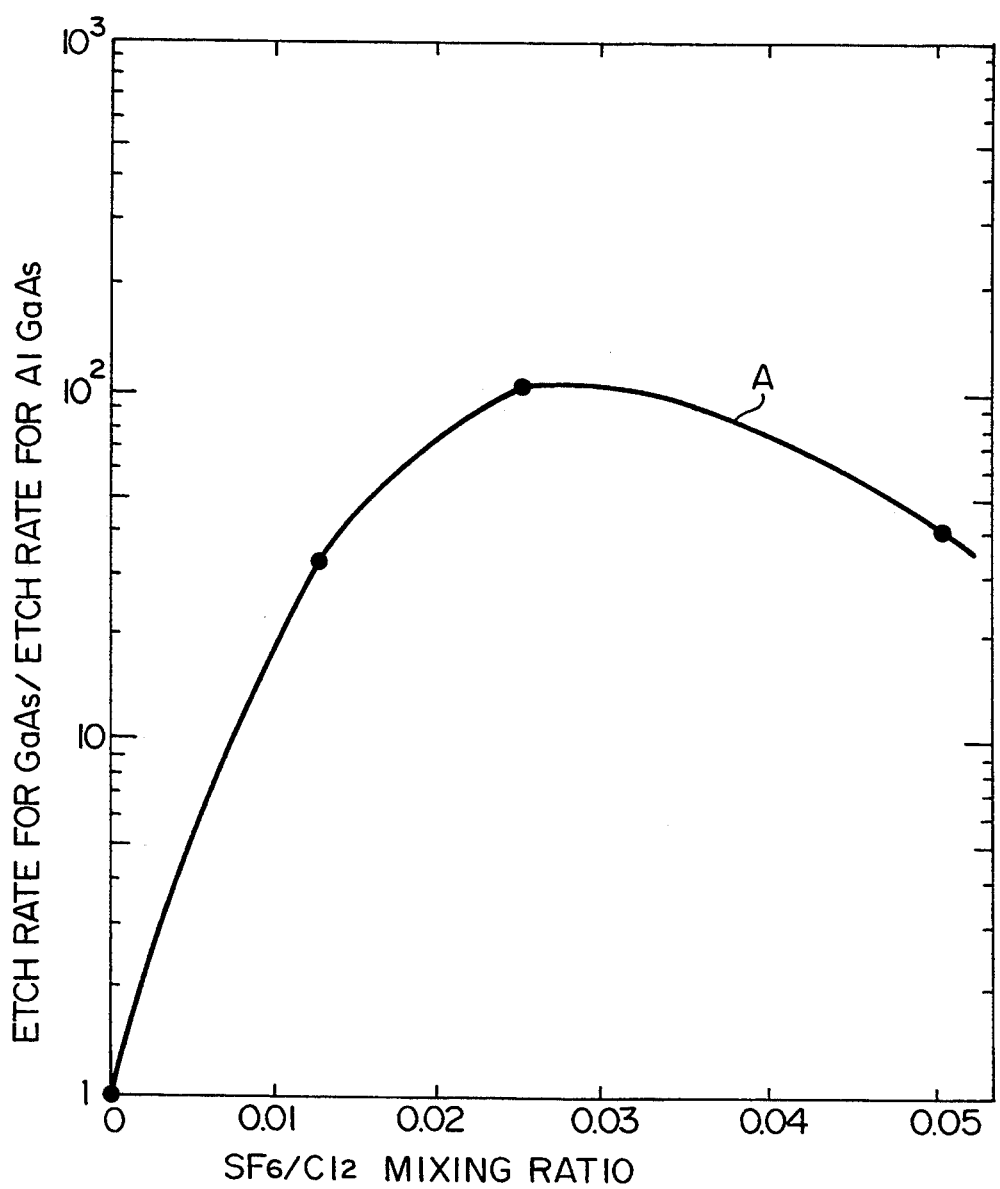
FIG. 2 is a graph showing the selectivity of an etchant according to the present invention in terms of the chlorine gas/sulfur hexafluoride gas ratio.

The etchant 4a is formed of gaseous mixture containing chlorine and sulfur hexafluoride, and the selectivity of the etchant 4a is shown in FIG. 2. Plots A is indicative of the ratio between the etch rate for gallium arsenide and the etch rate for aluminum gallium arsenide in terms of the mixing ratio of the sulfur hexafluoride gas to the chlorine gas. The etch rates are measured in the dry etching system shown in FIG. 1 under the conditions of the flow rate at about 34 sccm, the vacuum ambience at about $7 \times 10^{-4}$ torr, the microwave radiation at about 300 watts and the rf biasing power at about 50 watts. While the mixing ratio was "0", no selectivity took place between the gallium arsenide and the aluminum gallium arsenide. However, if the sulfur hexafluoride gas was mixed in the chlorine gas, the selectivity of the etchant was increased with the content of the sulfur hexafluoride gas, and the selectivity of the etchant was maximized at the mixing ratio of about 0.025. However, the selectivity was decreased with the sulfur hexafluoride gas after the maximum mixing ratio. Though not indicated by Plots A, if the etchant contained only the sulfur hexafluoride gas, the ratio of the etch rates returned to "1" again. Thus, the present inventor confirmed that the ratio between the etch rates was maximized at the mixing ratio of about 0.025 and was as large as about 100. However, the selectivity took place in the mixing ratio greater than 0 and less than 1, and more than tens etch rate ratio was achieved at least in the mixing ratio between 0.01 and 0.05 under the condition described hereinbefore.

Figure 3:
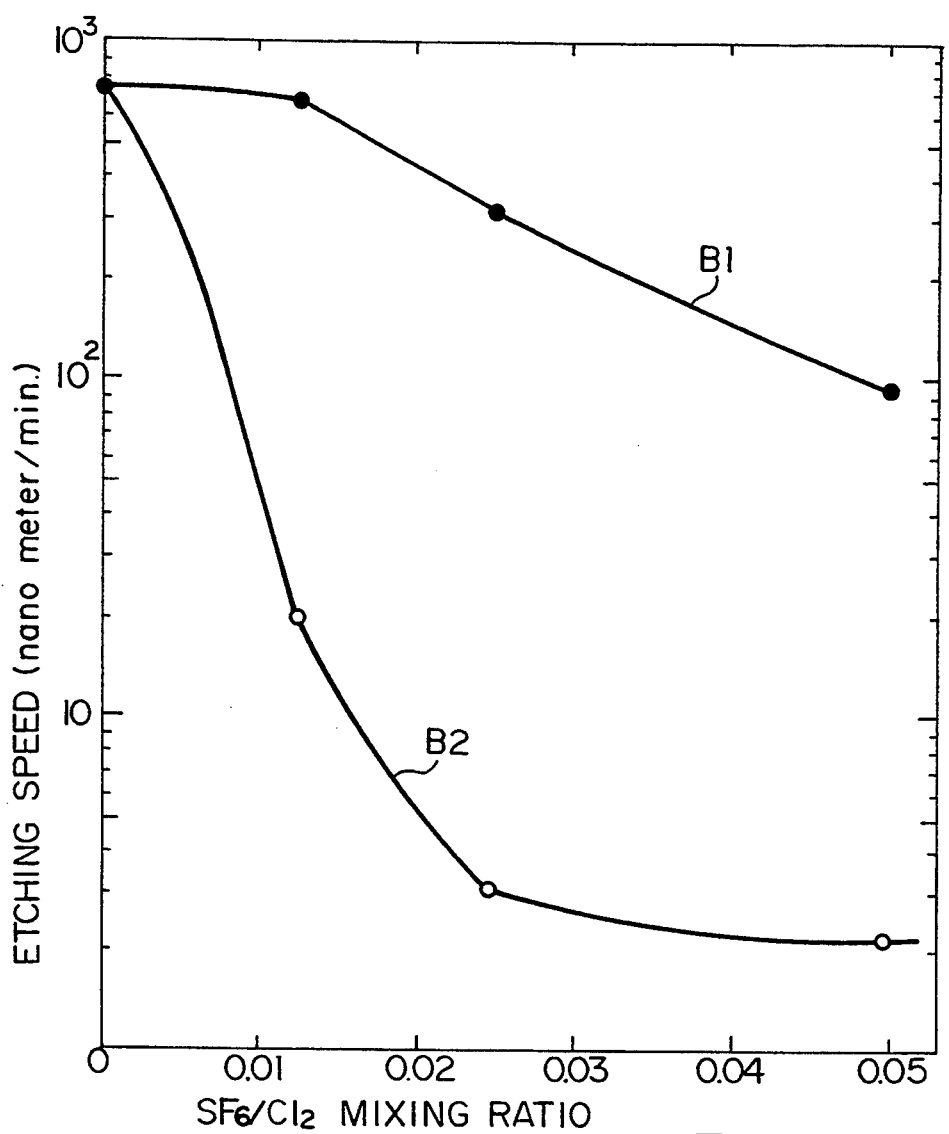
FIG. 3 is a graph showing etch rates of the etchant in terms of the chlorine gas/sulfur hexafluoride gas ratio.

FIG. 3 shows etching speeds in the gallium arsenide as well as in the aluminum gallium arsenide, and the flow rate and the vacuum ambience were at about 34 sccm and at about $7 \times 10^{-4}$ torr, respectively. Plots B1 stand for the etching speed in the gallium arsenide, and plots B2 is representative of the etching speed in the aluminum gallium arsenide. The etching speeds were decreased with the mixing ratio. This is because of the fact that reactants or fluorides were respectively produced on the gallium arsenide and the aluminum gallium arsenide. Both fluorides prevented the gallium arsenide and the aluminum gallium arsenide from reaction with the etchant. However, the reaction between the aluminum gallium arsenide and the etchant was effectively decelerated in the presence of the fluoride on the aluminum gallium arsenide.

Figure 4:
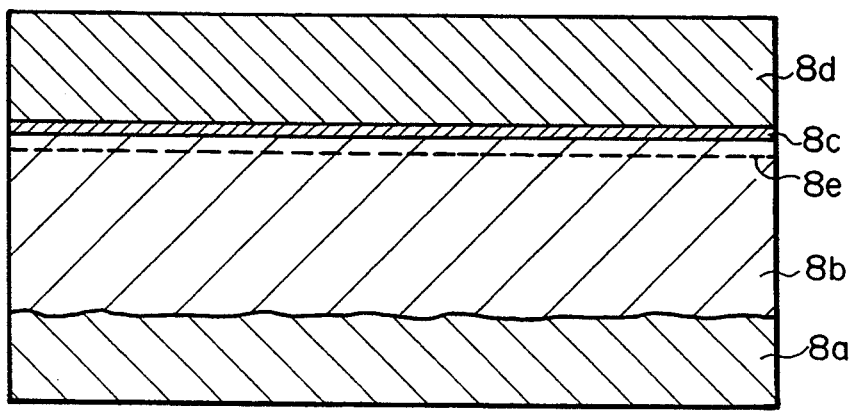
FIG. 4 is a cross sectional view showing a multi-level semiconductor structure to which the dry etching process according to the present invention is applied.

In order to evaluate the damage of the compound semiconductor film attached by the etchant 4a, a semiconductor structure shown in FIG. 4 was prepared. On a highly resistive gallium arsenide substrate 8a were successively grown an intentionally undoped gallium arsenide buffer layer 8b, an intentionally undoped Aluminum gallium arsenide film 8c expressed as $Al_{0.3}Ga_{0.7}As$ and an aluminum gallium arsenide film 8d expressed as $Al_{0.3}Ga_{0.7}As$ and doped with silicon atoms at about $2 \times 10^{18}$ cm$^{-3}$ which are about 0.5 micron in thickness, about 6 nanometers in thickness and about 60 nanometers in thickness. The semiconductor structure thus laminated can serve as a heterojunction field effect transistor with a highly conductive channel implemented by a two-dimensional electron gas layer 8e. The electron density and the electron mobility were measured at 77 degrees in Kelvin scale prior to the dry etching process according to the present invention.

The semiconductor structure was subjected to the dry etching using the etchant 4a with the mixing ratio of about 0.025. The semiconductor structure was exposed to the etchant 4a for a certain time period, and the certain time period was tantamount to etching for the gallium arsenide of about 200 nanometers. Since the ratio of the etch rates was as large as about 100 at the mixing ratio of 0.025, the aluminum gallium arsenide layer 8d is uniformly removed by about 2 nanometers. The electron density and the electron mobility were measured at 77 degrees in Kelvin scale after the dry etching process again.

Figure 5:
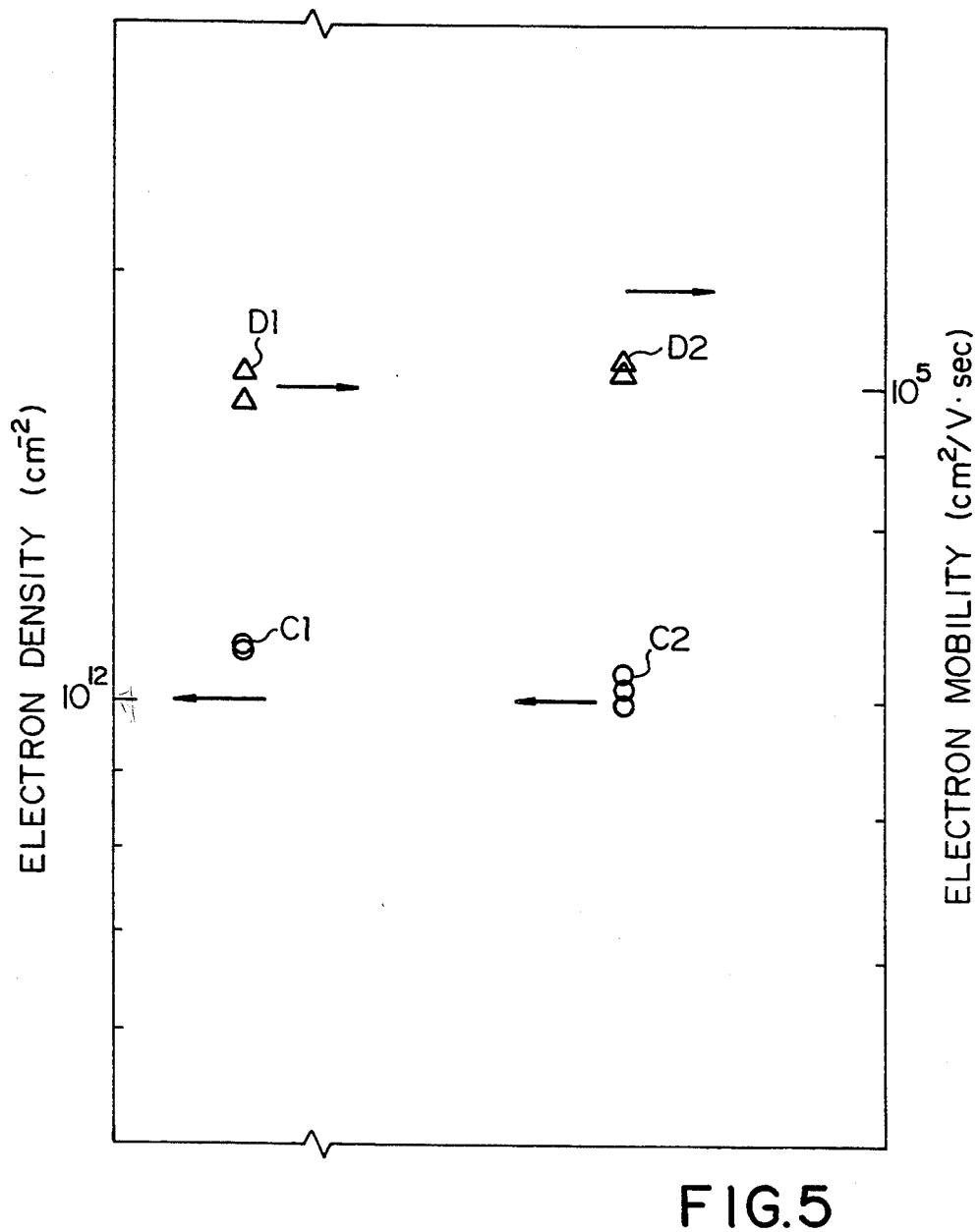
FIG. 5 is a graph showing electron density and electron mobility of the multi-level semiconductor structure between pre-etched state and post-etched state.

The electron density and the electron mobility are illustrated in FIG. 5. Bubbles C1 and C2 stand for the electron density, and triangles D1 and D2 stand for the electron mobility. Suffix "1" means pre-etching state or the data measured before the dry etching, and suffix "2" means post-etched state or the data measured after the dry etching. The bubbles C2 and the triangles D2 are approximately equal to the bubbles C1 and the triangles D1, and no substantial damage takes place in the semiconductor structure in the dry etching according to the present invention.

As will be understood from the foregoing description, the etchant 4a achieves excellent selectivity without Fluon. Since only a small amount of the sulfur hexafluoride gas achieves the excellent selectivity, the content of fluorine is extremely small, and the selectivity is adjustable by changing the content of the sulfur hexafluoride gas.

Another advantage of the etchant 4a is to be free from undesirable plasma polymerized film. This is derived from the composition of the etchant 4a. Namely, the plasma polymerized film is considered to be produced in the presence of carbon, and the etchant 4a does not contain any carbon. Thus, any plasma polymerized film is produced, and the self-bias is sufficiently lowered. This results in that the properties of the semiconductor structure are never deteriorated.

Although particular embodiments of the present invention have been shown and described, it will be obvious to those skilled in the art that various changes and modifications may be made without departing from the spirit and scope of the present invention. For example, the etchant formed of the gaseous mixture of chlorine and sulfur hexafluoride is available in a magnetron enhancement reactive etching system. The present inventors confirmed that the etchant achieves excellent selectivity under a low self-bias of about 10 volts without production of any plasma polymerized film. The damages of semiconductor structure were negligible.

What is claimed is:

1. A dry etching process comprising the steps of:
    a) preparing a plasma etching system having an etching chamber and assisted by means of electron cyclotron resonance, preparing a semiconductor structure having an aluminum gallium arsenide film and a gallium arsenide film, and supplying an etchant containing chlorine gas and sulfur hexafluoride gas, said etchant having a mixing ratio of said hexafluoride gas to said chlorine gas ranging from 0.01 to 0.05;
    b) placing said semiconductor structure in said etching chamber of said dry etching system; and c) supplying said etchant to said etching chamber for selectively etching said gallium arsenide film in regard to said aluminum gallium arsenide film.

2. A dry etching process comprising the steps of:
   a) preparing a plasma etching system having an etching chamber and assisted by means of electron cyclotron resonance, preparing a semiconductor structure having an aluminum gallium arsenide film and a gallium arsenide film, and supplying an etchant containing chlorine gas and sulfur hexafluoride gas, said etchant having a mixing ratio of said hexafluoride gas to said chlorine gas of 0.025;
   b) placing said semiconductor structure in said etching chamber of said dry etching system; and
   c) supplying said etchant to said etching chamber for selectively etching said gallium arsenide film in regard to said aluminum gallium arsenide film.

3. A dry etching process as set forth in claim 2, in which said dry etching system is a magnetron reactive ion etching system.

4. A dry etching process comprising the steps of:
   a) preparing a plasma etching system having an etching chamber and assisted by means of electron cyclotron resonance, a semiconductor structure having an aluminum gallium arsenide film and a gallium arsenide film, and an etchant containing chlorine gas and sulfur hexafluoride gas, said etchant having a mixing ratio of said hexafluoride gas to said chlorine gas of 0.025;
   b) placing said semiconductor structure in said etching chamber of said dry etching system; and
   c) supplying said etchant to said etching chamber for selectively etching said gallium arsenide film in regard to said aluminum gallium arsenide film, said etchant flowing at 34 sccm though said etching chamber at $7 \times 10^{-4}$ torr, microwave at 2.45 GHz being radiated into said etching chamber, said semiconductor structure being placed in a place where said electron cyclone resonance takes place, said semiconductor substrate being biased with radio frequency at 13.56 MHz and with a power wattage of 50 watts.

* * * * *